US010634757B1

United States Patent
Martens et al.

(10) Patent No.: US 10,634,757 B1
(45) Date of Patent: Apr. 28, 2020

(54) NONLINEAR TRANSMISSION LINE-BASED HARMONIC PHASE STANDARD

(71) Applicant: ANRITSU COMPANY, Morgan Hill, CA (US)

(72) Inventors: Jon Martens, San Jose, CA (US); Karam Noujeim, Los Altos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 310 days.

(21) Appl. No.: 15/293,018

(22) Filed: Oct. 13, 2016

Related U.S. Application Data

(60) Provisional application No. 62/240,826, filed on Oct. 13, 2015.

(51) Int. Cl.
| | |
|---|---|
| *G01R 35/00* | (2006.01) |
| *H03K 5/12* | (2006.01) |
| *H03K 5/02* | (2006.01) |
| *H03K 5/01* | (2006.01) |
| *G01R 27/28* | (2006.01) |

(52) U.S. Cl.
CPC .......... *G01R 35/005* (2013.01); *G01R 27/28* (2013.01); *H03K 5/01* (2013.01); *H03K 5/02* (2013.01); *H03K 5/12* (2013.01)

(58) Field of Classification Search
CPC ... H03K 5/12; H03K 5/02; H03K 5/01; G01R 27/28; G01R 35/005
USPC .................................................. 324/601, 650
See application file for complete search history.

(56) References Cited

U.S. PATENT DOCUMENTS

| | | | |
|---|---|---|---|
| 5,801,525 | A | 9/1998 | Oldfield |
| 5,812,039 | A | 9/1998 | Oldfield |
| 5,909,192 | A | 6/1999 | Finch |
| 5,977,779 | A | 11/1999 | Bradley |
| 6,049,212 | A | 4/2000 | Oldfield |
| 6,291,984 | B1 | 9/2001 | Wong |
| 6,316,945 | B1 | 11/2001 | Kapetanic |
| 6,331,769 | B1 | 12/2001 | Wong |
| 6,496,353 | B1 | 12/2002 | Chio |
| 6,504,449 | B2 | 1/2003 | Constantine |
| 6,509,821 | B2 | 1/2003 | Oldfield |

(Continued)

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

(Continued)

*Primary Examiner* — Amy He
(74) *Attorney, Agent, or Firm* — Tucker Ellis LLP

(57) ABSTRACT

A harmonic phase standard includes an input connectable with a radio frequency (RF) signal source for receiving an RF signal, an output, a signal path extending between the input and the output for propagating the RF signal from the input to the output, and a logic gate, an amplifier and a nonlinear transmission line (NLTL) arranged along the signal path. The logic gate receives the RF signal and outputs a waveform having sharpened edges relative to the RF signal. The amplifier amplifies the waveform output by the logic gate. The NLTL receives the amplified waveform from the amplifier and is biased to shape the amplified waveform so as to add harmonic content to the amplified waveform.

15 Claims, 6 Drawing Sheets

(56) References Cited

U.S. PATENT DOCUMENTS

| | | |
|---|---|---|
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |
| 6,711,225 B1 | 3/2004 | Sutardja |
| 6,714,898 B1 | 3/2004 | Kapetanic |
| 6,766,262 B2 | 7/2004 | Martens |
| 6,826,245 B1 | 11/2004 | Brown |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 * | 5/2005 | Noujeim ............... H01P 3/003 333/20 |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,054,776 B2 | 5/2006 | Bradley |
| 7,068,046 B2 | 6/2006 | Martens |
| 7,088,111 B2 | 8/2006 | Noujeim |
| 7,108,527 B2 | 9/2006 | Oldfield |
| 7,126,347 B1 | 10/2006 | Bradley |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,496 B2 | 3/2009 | Schiano |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,792,230 B1 | 9/2010 | Gallagher |
| 7,795,230 B2 | 9/2010 | Michelet |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 | 10/2012 | Noujeim |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,718,586 B2 * | 5/2014 | Martens ............... G01R 27/32 324/650 |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2004/0076246 A1 | 4/2004 | Vanderperren |
| 2006/0250135 A1 | 11/2006 | Buchwald |
| 2011/0037667 A1 | 2/2011 | Varjonen |
| 2011/0050995 A1 | 3/2011 | Ozawa |
| 2014/0368216 A1 * | 12/2014 | Pailloncy ............ G01R 25/00 324/602 |
| 2015/0377941 A1 * | 12/2015 | Benedikt ............ G01R 35/007 324/601 |
| 2016/0050032 A1 | 2/2016 | Emerson |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE ® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

(56) References Cited

OTHER PUBLICATIONS

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE © 2016, 4 pages.

\* cited by examiner

NONLINEAR TRANSMISSION LINE-BASED HARMONIC PHASE STANDARD

CLAIM OF PRIORITY

This application claims the benefit of priority to U.S. Provisional Application titled "NONLINEAR TRANSMISSION LINE BASED HARMONIC PHASE STANDARD", Application No. 62/240,826, filed Oct. 13, 2015, which application is herein incorporated by reference.

TECHNICAL FIELD

The present invention relates to harmonic phase standards for establishing a phase reference for use with measurement equipment for determine phase response of a device under test (DUT).

BACKGROUND

Determining the performance and behavior of a telecommunication (telecom) network includes nonlinear characterization and modeling of components of the network. A component (or group of components) characterized using test signals from a measurement instrument is referred to as a device under test (DUT). A typical response of a DUT to a stimulus generated by a vector network analyzer (VNA) using a pair of tones, for example, includes a signal with a number of different frequency components including harmonics, intermodulation distortion products, modulation sidebands, etc. The frequency components are generated through the nonlinear behavior of the DUT. It is not possible to accurately determine the phase of all of these components using a VNA with conventional calibrations because the measurement hardware phase lengths are different at different frequencies.

Referring to FIG. 1, a harmonic phase standard 102 can be used with a VNA 10 to establish a phase reference for use in nonlinear measurements. A first port 12 of the VNA is connected with an input of the harmonic phase standard 101 while an output 103 of the harmonic phase standard is connected with a second port 14 of the VNA. The harmonic phase standard receives a signal from the VNA and introduces nonlinearities to the received signal and then provides the modified signal to the receiver of the VNA. The signal provided to the VNA can, for example, be stepped through a set of frequencies to characterize phase response to nonlinearities at different frequencies within the set of frequencies. The phase response is used to establish a phase reference.

A harmonic phase standard creates a waveform rich in signal content to act as a transfer standard so that the phase relationship of all of the components of that signal content can be determined. Knowledge of the phase relationship can then be transferred to a receiver of the VNA so that the VNA can accurately measure the phase of signal components coming from the DUT. The phase reference can be used in conjunction with load-pull systems, for example, and large-signal VNAs to characterize and model the nonlinear behavior of DUTs in a telecom network.

Traditional harmonic phase standards can be based on several different electronic components. For example, a traditional harmonic phase standard can be based on the use of a Schottky diode, as described in the article "Measurement of Magnitude and Phase of Harmonics Generated in Nonlinear Microwave Two-ports," authored by U. Lott and published in the journal IEEE Transactions on Microwave Theory and Techniques, vol. 37, pp. 1506-1511, October 1989. However, it has been observed that the approach of using a Schottky diode can result in output that is limited in harmonic content.

In another approach, a traditional harmonic phase standard can be based on the use of a step-recovery diode, as described in the paper "Harmonic Generation using Step Recovery Diodes and SRD Modules", Application Note 920, provided by Agilent Technologies. However, it has been observed that the approach of using a step-recovery diode suffers from phase stability issues.

In another approach, a traditional harmonic phase standard can be based on the use of an indium phosphide (InP)-based device such as a comb generator by Agilent Technologies. However, it has been observed that the approach of using an InP-based device provides high phase stability at the expense of limited frequency scalability due to circuit complexity. It can also suffer from degraded phase flatness with frequency.

SUMMARY

In accordance with an embodiment, a harmonic phase standard includes an input connectable with a radio frequency (RF) signal source for receiving an RF signal, an output, a signal path extending between the input and the output for propagating the RF signal from the input to the output, and a logic gate, an amplifier and a nonlinear transmission line (NLTL) arranged along the signal path. The logic gate receives the RF signal, buffers it in an amplitude-insensitive manner, and outputs a waveform having modestly sharpened edges relative to the RF signal. The amplifier amplifies the waveform output by the logic gate. The NLTL receives the amplified waveform from the amplifier and is biased to shape the amplified waveform so as to add harmonic content to the amplified waveform. In an embodiment, the NLTL is biased to sharpen the falling edges of the amplified waveform. The NLTL provides the bulk of the sharpening so that much higher frequency content can be generated (e.g., >10 GHz).

In accordance with an embodiment, the NLTL is biased by one of an active and a passive bias and comprises a pair of high-impedance transmission lines loaded periodically with varactor diodes formed on a gallium arsenide (GaAs) substrate.

In accordance with an embodiment, the harmonic phase standard further includes a pulse-forming network arranged along the signal path to receive a waveform output from the NLTL and provide at least one of unipolar and bipolar pulses.

In accordance with an embodiment, the harmonic phase standard further includes a first power splitter arranged along the signal path for splitting an RF signal received from the RF signal source and outputting a first RF signal to the logic gate and outputting a second RF signal to an output port and a second power splitter for splitting the at least one of unipolar and bipolar pulses into two output signals at two output ports.

In accordance with an embodiment, the first power splitter and the pulse-forming network and the second power splitter is a coplanar waveguide having a central conductor arranged between a pair of ground planes and a set of air bridges forming a pair of open-circuited stubs connected between ground planes and spanning over the central conductor.

In accordance with an embodiment, a method of calibrating a VNA for measuring the phase response of a DUT to a test signal includes connecting a first port of the VNA to an input of a harmonic phase standard, connecting a second port of the VNA to an output of the harmonic phase standard, transmitting a set of RF signals at a set of frequencies to the input of the harmonic phase standard via the first port of the VNA, receiving a set of response signals in response to the set of RF signal from the output of the harmonic phase standard via the second port of the VNA, generating a calibration file for correcting relative phases of frequency components corresponding to the set of frequencies and storing the calibration file at the VNA for measuring the phase response of the DUT.

In such an embodiment, the harmonic phase standard includes the input, the output, a signal path extending between the input and the output for propagating the RF signal from the input to the output, a logic gate arranged along the signal path for receiving a RF signal and outputting a waveform having sharpened edges relative to the RF signal, an amplifier arranged along the signal path to amplify the waveform output by the logic gate and a NLTL arranged along the signal path for receiving the amplified waveform from the amplifier, wherein the NLTL is biased to sharpen the falling edges of the amplified waveform edges.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the FIG. in which the part or element is first discussed.

Excessive harmonic generation and the generation of intermodulation distortion products by components such as amplifiers or other nonlinear components in a communications device or network can lead to violations of spectrum rules set by the Federal Communications Commission (FCC), failed performance specifications, interference with other channels, or other problems. Nonlinear characterization of components is useful in many microwave, millimeter wave, and radio frequency (RF) applications including wireless communications for identifying nonlinear behavior resulting in such failures.

Techniques for obtaining magnitude and phase measurements of a DUT in response to a stimulus have been developed using VNAs. As noted above, a harmonic phase standard is provided for calibration to eliminate phase errors when correcting measurements of a DUT. The objective of the harmonic phase standard is to create a stable set of harmonics from a nonlinearity to calibrate phase pattern versus frequency. Calibration is then applied during measurement of a DUT to obtain the DUT harmonic phase response relative to the source fundamental.

To characterize and model the nonlinear behavior of a DUT, a VNA can be used in conjunction with load-pull systems that systematically varies the impedance presented to the DUT (at the stimulus frequency and often at the harmonics of that frequency). The harmonic phase calibration enables collecting that multi-harmonic data coherently. Performance of the DUT and the associated conditions to deliver that performance in a network can then be assessed. While load-pull itself implies impedance variation at the load port, impedance can also be varied at any of the ports of the DUT, most often at the source.

Figure 1:
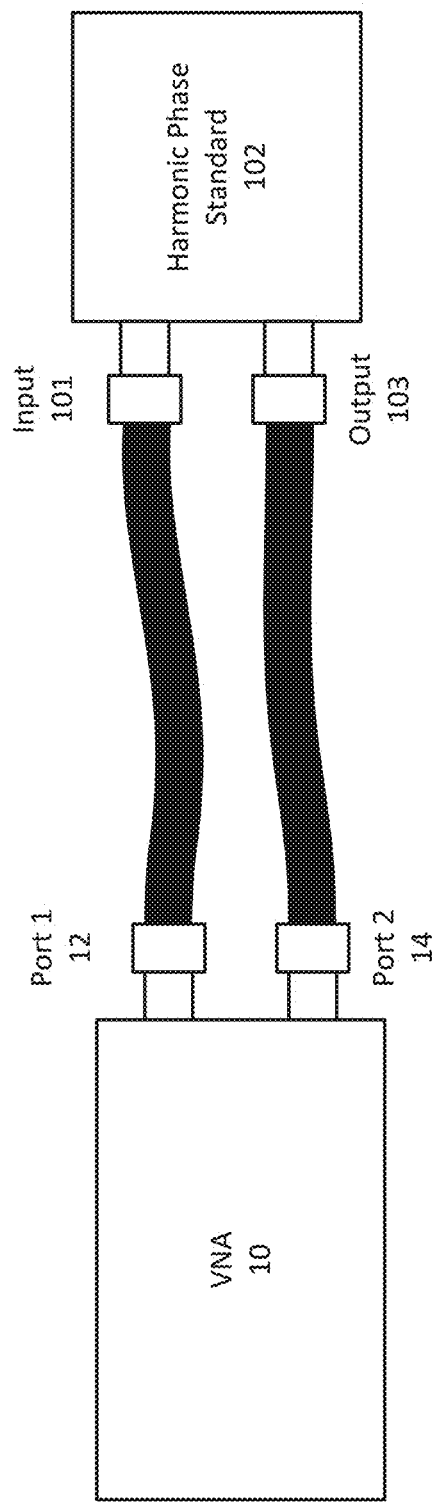
FIG. 1 is a simplified view of a VNA connected with a harmonic phase standard for generating a calibration file for use by the VNA to measure phase response of a DUT, in accordance with an embodiment.
Figure 2:
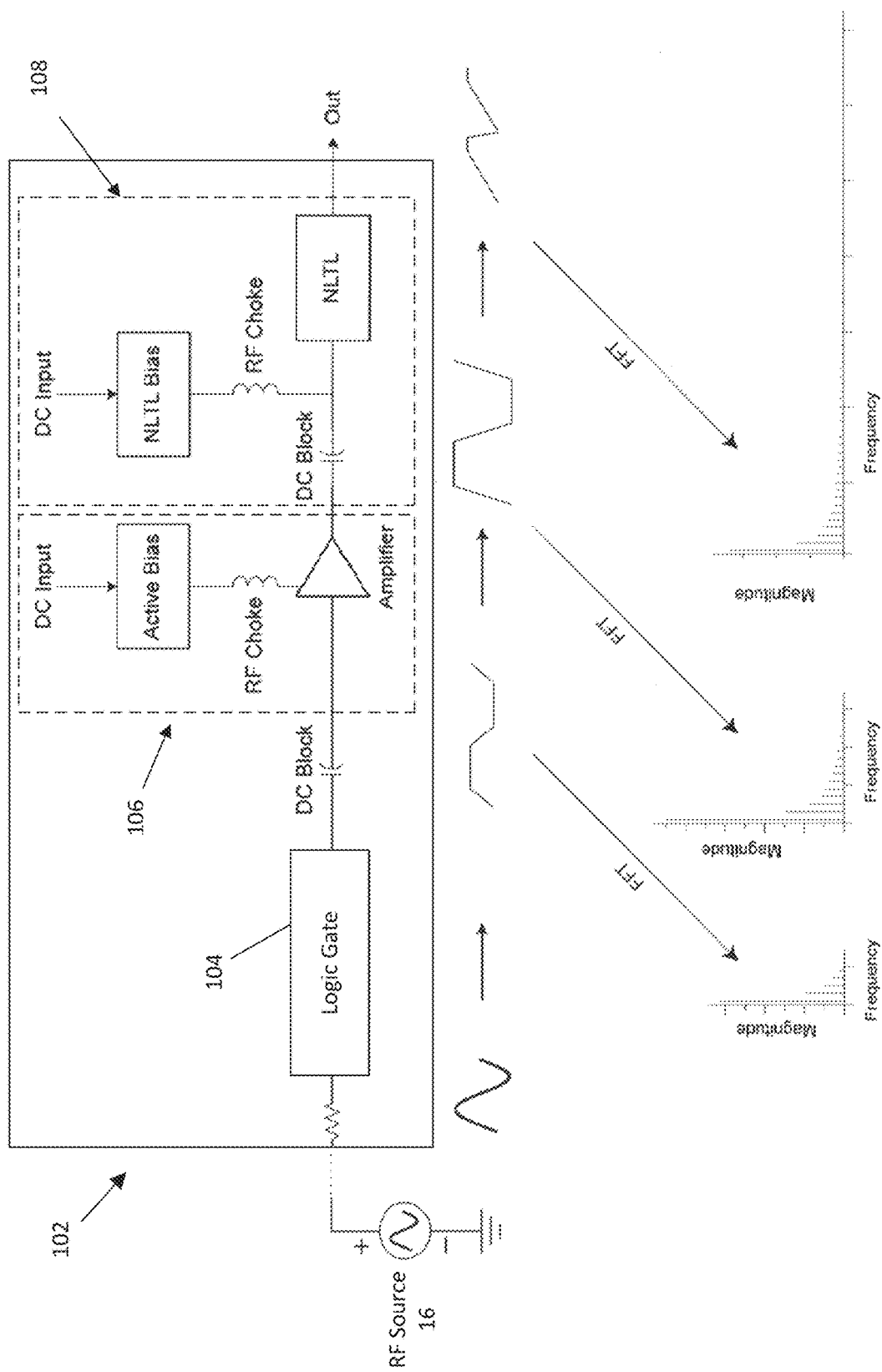
FIG. 2 is a block circuit diagram of a nonlinear transmission line (NLTL)-based harmonic phase standard, in accordance with an embodiment.

FIG. 2 illustrates a circuit diagram for a harmonic phase standard in accordance with embodiment. The harmonic phase standard 102 comprises a logic gate 104, an amplifier 106 and a nonlinear transmission line (NLTL) 108. An NLTL is a distributed device that supports the propagation of nonlinear electrical waves such as shocks and solutions. The NLTL provides an ability to generate a controllable and stabile, but very sharp non-linearity.

The harmonic phase standard receives a stimulus from an RF source 16 of a VNA. The stimulus can be a tone or a modulated signal. The stimulus can also be a pulsed signal or a continuous wave (CW) signal. A logic gate 104 receives the RF signal, buffers it in an amplitude-insensitive manner. The logic gate outputs a waveform that is generally consistent in amplitude and substantially independent from the amplitude of the input signal. The circuit is thereby made insensitive to measurement instrument setup and environment influence. The waveform of the signal produced is also modestly sharpened relative to the stimulus, adding harmonic content to the waveform. In an embodiment, the logic gate can comprise a monocycle former that generates narrow pulses referred to as monocycles. The waveform produced by the logic gate is amplified at an amplifier block 106 to boost the amplitude of the waveform as appropriate for use by the NLTL. The NLTL is DC-biased to sharpen the falling edge of the amplified waveform, adding further harmonic content to the waveform. The NLTL provides the bulk of the sharpening so that much higher frequency content can be generated (e.g., >10 GHz). In other embodiments, the NLTL can biased to sharpen the rising edge of the amplified waveform rather than the falling edge.

An exemplary signal is shown propagating along the circuit with waveforms resulting from each section of the circuit represented below the circuit. An exemplary fast Fourier transform (FFT) is shown of the frequency components of the waveform converted to the frequency domain. The FFT illustrates the additional harmonic content at higher frequencies produced with each resultant waveform at each stage of the circuit.

Figure 3:
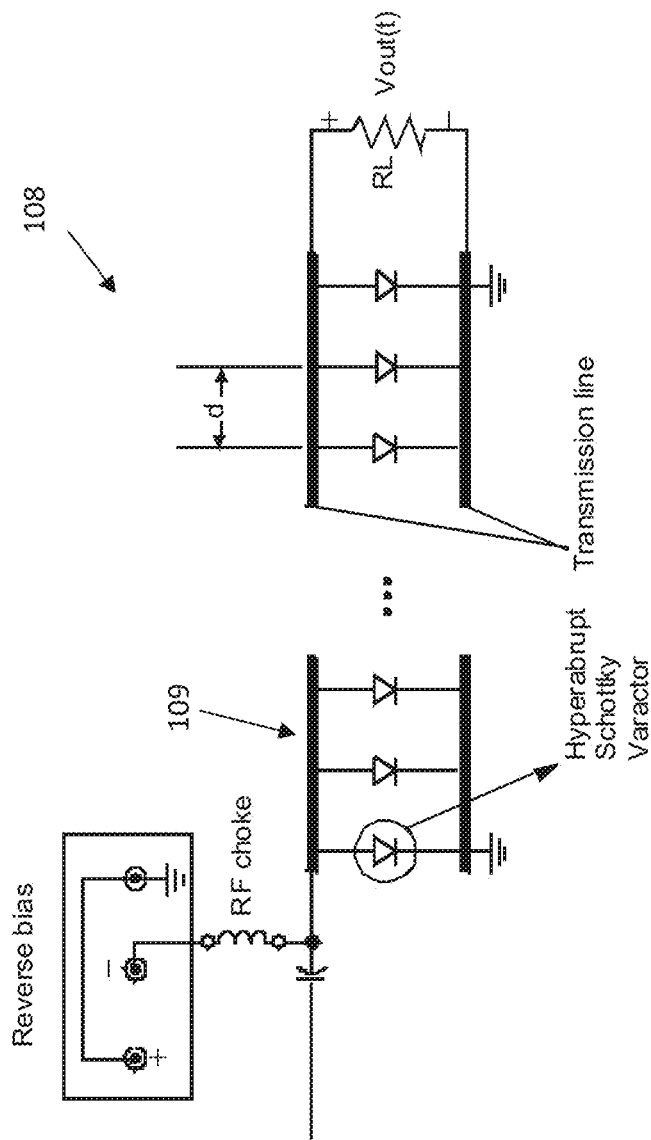
FIG. 3 is a simplified circuit diagram of a NLTL, in accordance with an embodiment.

Referring to FIG. 3, in an embodiment the NLTL can comprise high-impedance transmission lines loaded periodically with varactor diodes so as to form a propagation medium whose phase velocity, and thus time delay is a function of the instantaneous voltage. For a step-like waveform, the trough of a wave travels at a faster phase velocity than the peak, resulting in compression of the fall time, and thus the formation of a steep wave front that approaches that of a shock wave. When driven with a sinusoidal signal, an NLTL circuit compresses the fall time of a signal, resulting in a waveform that is rich in high-frequency harmonics. The NLTL is provided with a bias, which can be active or passive and can control the resulting compression of the fall time of the resulting waveform. A reference circuit, such as a closed-looping bias system can maintain bias consistency. The signal produced by the NLTL is the resultant output of the harmonic phase standard and can be provided to the receiver of the VNA.

In an embodiment, a monolithic implementation of the NLTL circuit can be formed on a gallium arsenic (GaAs) substrate. In contrast with prior art techniques in which the input frequency is limited to a few hundred megahertz (MHz), an input frequency range of an NLTL can be designed to span gigahertz (GHz) frequencies, and is governed by the input Bragg frequency (i.e. spacing d between cells) of the shockline 109 of the NLTL.

A calibration file is generated based on the output of the harmonic phase standard. The calibration file can be stored at the DUT and applied to the output frequency components of responses of DUTs that are thereafter measured to phase-correct those output frequency components at the receiver of the VNA to account for the measurement hardware phase lengths.

It is observed that harmonic phase standards in accordance with presently disclosed embodiments have high phase stability as a result of using low jitter logic gates and modulator drivers, and the distributed reactive nature of the NLTL. The output frequency spectrum of the harmonic standard is scalable by virtue of the scalability of the NLTL fall time.

Figure 4:
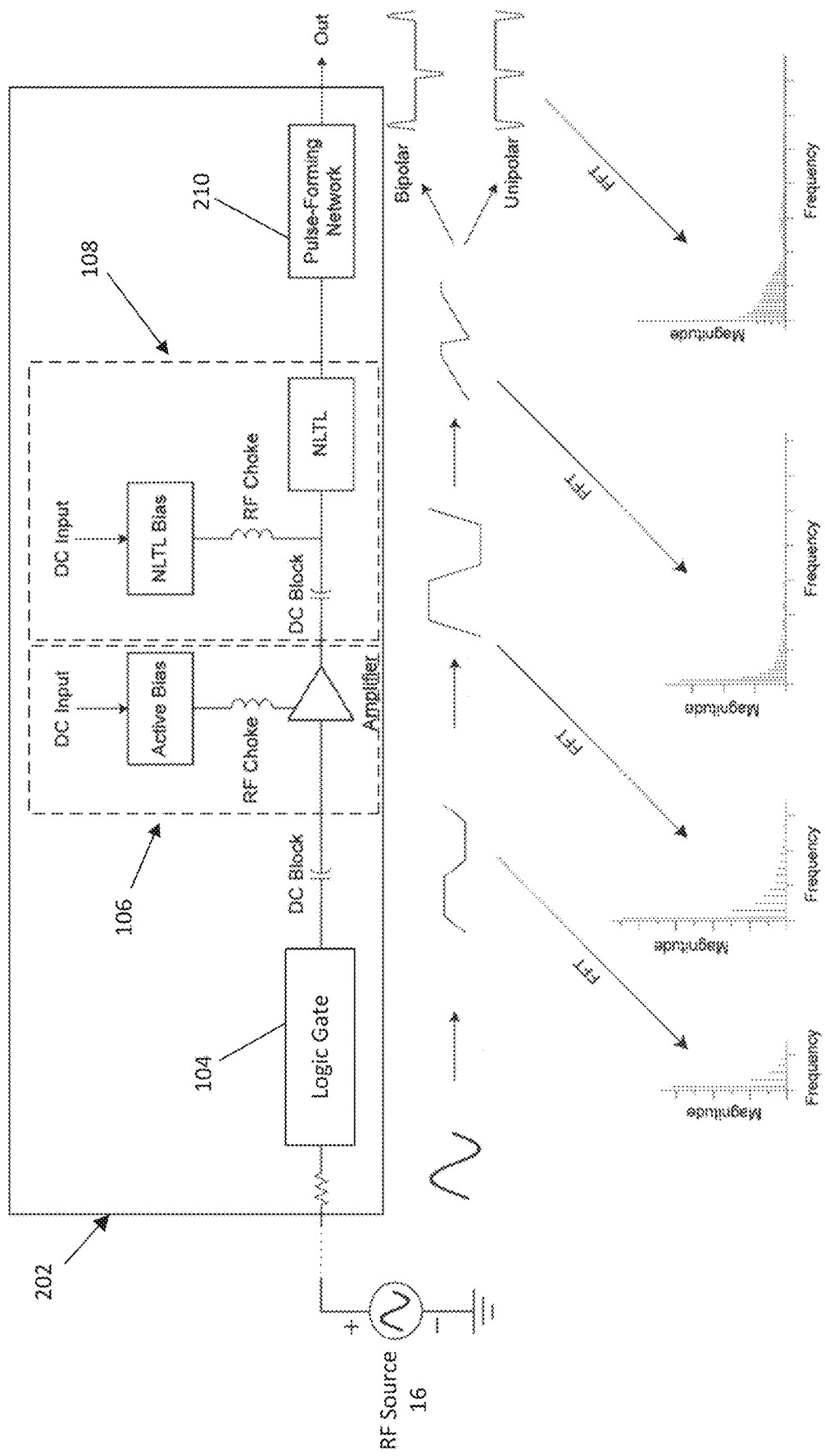
FIG. 4 is a block circuit diagram of a NLTL-based harmonic phase standard, in accordance with another embodiment.

FIG. 4 illustrates a circuit diagram for a harmonic phase standard 202, in accordance with another embodiment. In such an embodiment, the circuit of the embodiment of FIG. 2 further includes a pulse-forming network 210 that can generate bipolar and unipolar pulses of relatively high-voltage. Also shown in FIG. 4 is an exemplary waveform of a signal propagating along the circuit and an exemplary FFT converting a series of waveforms to the frequency domain.

The pulse-forming network can transform the sharp falling edge of the waveform to a sharp pulse, in the time domain. In the frequency domain, this change the distribution of frequency components produced by the circuit. The pulse-forming network acts as a high pass filter so the lower frequency components are deemphasized, while emphasizing the higher frequency components.

Figure 5:
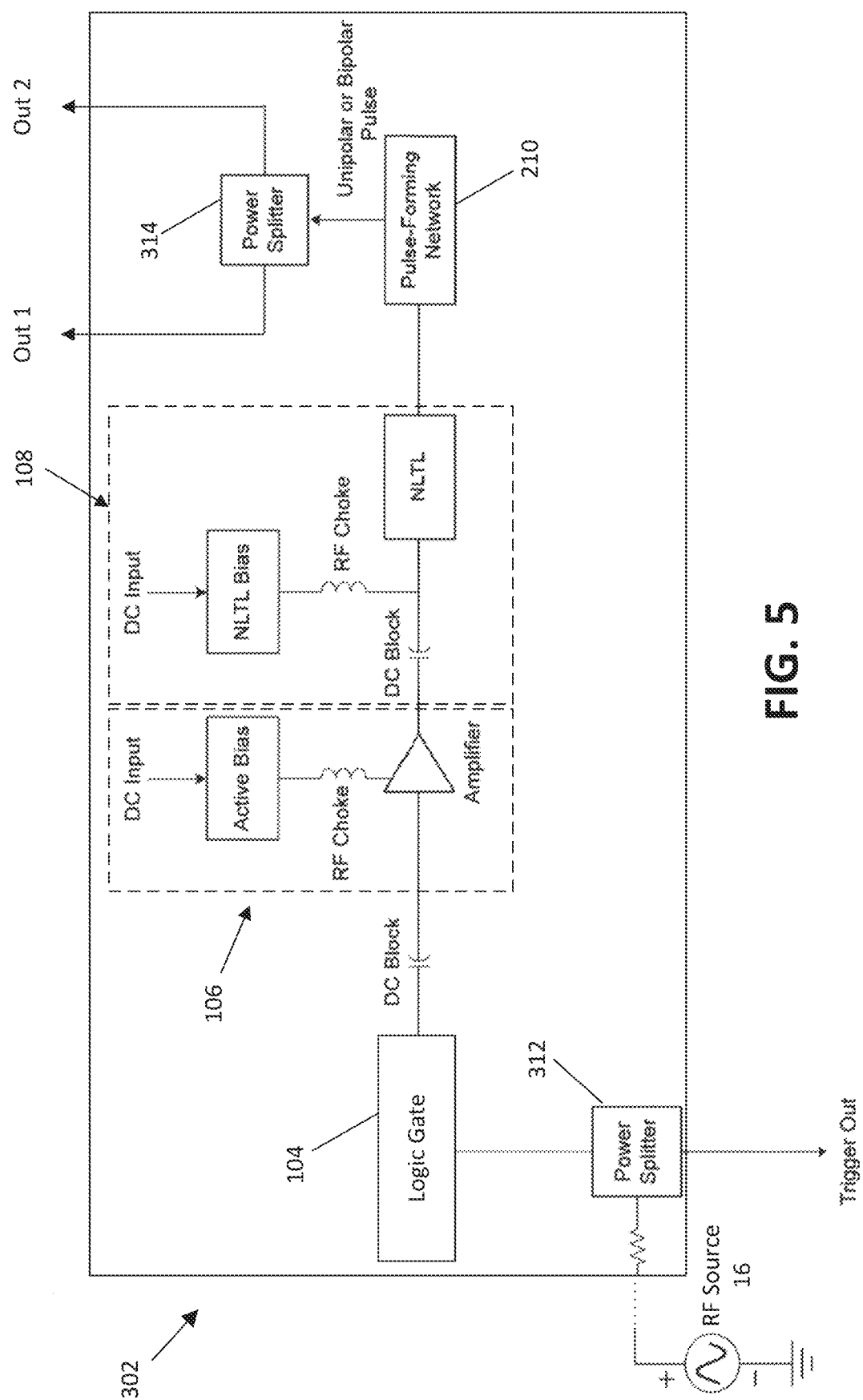
FIG. 5 is a block circuit diagram of a NLTL-based harmonic phase standard, in accordance with a further embodiment.

FIG. 5 illustrates a circuit diagram for a harmonic phase standard 302, in accordance with another embodiment. In such an embodiment, the circuit of the embodiment of FIG. 5 further includes power splitters 312, 314 at both an input from the RF source signal and an output from a pulse-forming network. The input power splitter provides an RF signal to the main harmonic phase standard circuit and further provides a trigger out signal. The output power splitter at the circuit output provides a pair of output signals (Out 1 and Out 2).

The power splitters are passive networks for simplifying measurement protocol. The input power splitter can be used to synchronize the measurement instrument with another measurement instrument or other test equipment. For example, a VNA can be synchronized with an oscilloscope via the trigger out of the input power splitter. The output power splitter can provide an extra reference tap off that can be fed to another receiver of the VNA for some other measurement.

Figure 6:
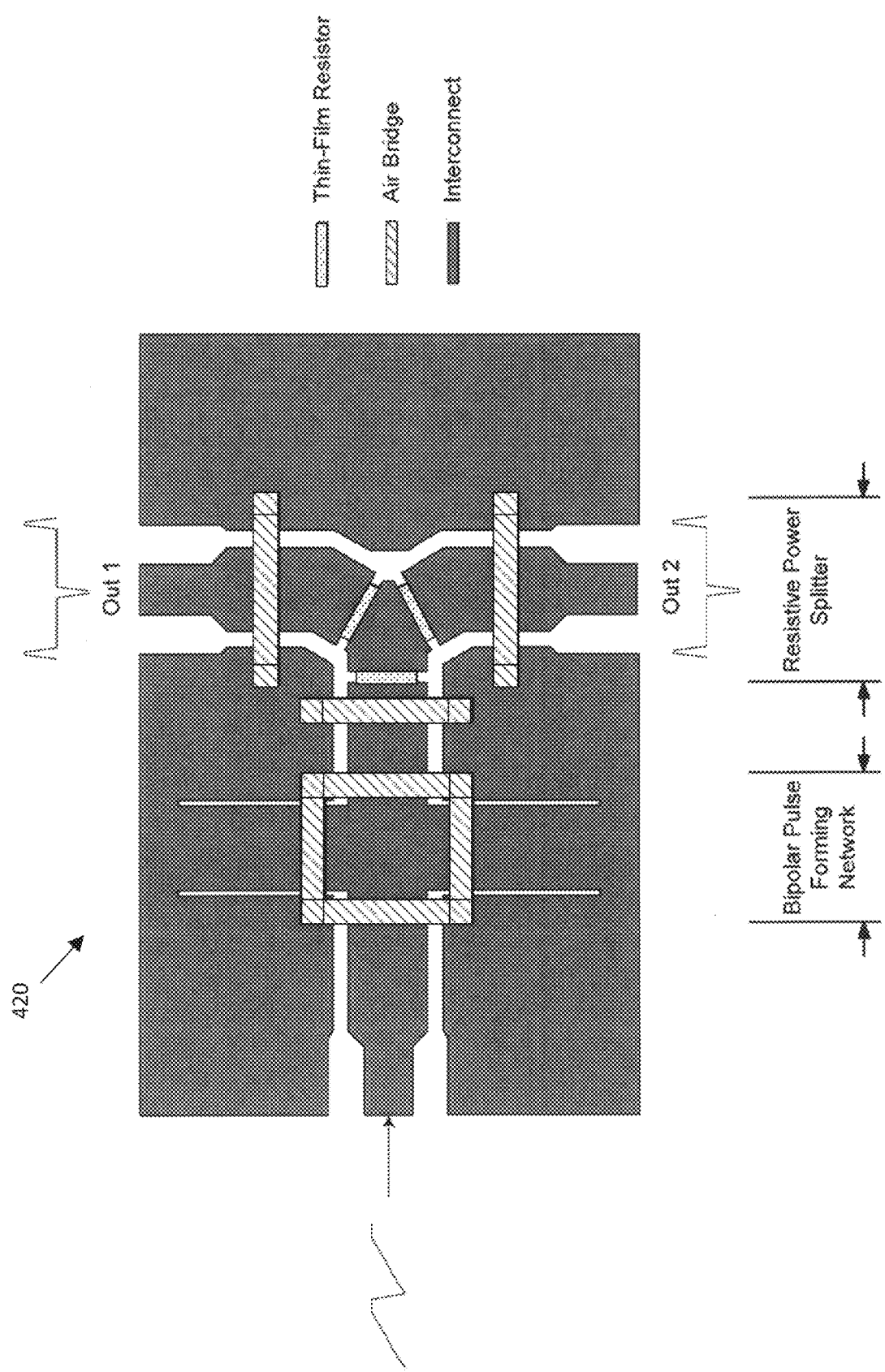
FIG. 6 is a plan view of a coplanar waveguide (CPW) bipolar pulse former and resistive power splitter, in accordance with an embodiment.

FIG. 6 illustrates a bipolar pulse former and power splitter 420, in accordance with an embodiment. The pulse former and power splitter can be used, for example, with embodiments of harmonic phase standards such as shown in FIG. 5. The pulse former is a coplanar waveguide (CPW) bipolar pulse former and resistive power splitter that receives a pulsed signal from an NLTL with a compressed fall time and generates bipolar pulses as a pair of output signals, Out 1 and Out 2. The ground planes of the CPW are connected by air bridges comprising metallic bridges elevated over and spanning the central conductor and elevated over and spanning the output conductors providing signals Out 1 and Out 2. The air bridges are elevated some small distance over the central conductor (e.g., tens of microns). The air bridges form a pair of open-circuited stubs. Thin-film resistors are connected between the central conductor and the output conductors.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A harmonic phase standard for establishing a phase reference for a vector network analyzer (VNA) comprising:
    an input port connected to a first port of the VNA for receiving an input RF signal from the first port of the VNA;
    an output port connected to a second port of the VNA for transmitting an output RF signal to the second port of the VNA;
    a signal path extending between the input port and the output port for propagating the RF signal from the input port to the output port;
    a logic gate arranged along the signal path for receiving the RF signal and outputting a waveform having sharpened edges relative to the RF signal;
    an amplifier arranged along the signal path to amplify the waveform output by the logic gate; and
    a nonlinear transmission line (NLTL) arranged along the signal path for receiving the amplified waveform from the amplifier, wherein the NLTL is biased to shape the amplified waveform so as to add harmonic content at higher frequencies to the amplified waveform;
    whereby the output RF signal transmitted from the output port to the second port of the VNA comprises additional harmonic content at higher frequencies compared to the input RF signal.

2. The harmonic phase standard of claim 1, wherein the NLTL is biased to sharpen the falling edges of the amplified waveform.

3. The harmonic phase standard of claim 1, wherein the NLTL is biased by one of an active and a passive bias.

4. The harmonic phase standard of claim 1, wherein the NLTL comprises a pair of high-impedance transmission lines loaded periodically with varactor diodes formed on a gallium arsenide (GaAs) substrate.

5. The harmonic phase standard of claim 1, wherein the logic gate is a monocycle former.

6. The harmonic phase standard of claim 1, further comprising:
a pulse-forming network arranged along the signal path, and
wherein the pulse-forming network receives a waveform output from the NLTL and provides at least one of unipolar and bipolar pulses to the output port.

7. The harmonic phase standard of claim 6, further comprising:
a first power splitter arranged along the signal path for splitting an RF signal received from the RF signal source and outputting a first RF signal to the logic gate and outputting a second RF signal; and
a second power splitter for splitting the at least one of unipolar and bipolar pulses into two output signals at the output port and another output port.

8. The harmonic phase standard of claim 7, wherein the pulse-forming network and the second power splitter comprise:
a coplanar waveguide having a central conductor arranged between a pair of ground planes; and
a set of air bridges forming a pair of open-circuited stubs connected between ground planes and spanning over the central conductor.

9. A harmonic phase standard for establishing a phase reference for a vector network analyzer (VNA) comprising:
an input port connected to a first port of the VNA for receiving an input RF signal from the first port of the VNA;
an output port connected to a second port of the VNA for transmitting an output RF signal to the second port of the VNA;
a signal path extending between the input port and the output port for propagating the RF signal from the input port to the output port;
a logic gate arranged along the signal path for receiving the RF signal and outputting a waveform having sharpened edges relative to the RF signal;
an amplifier arranged along the signal path to amplify the waveform output by the logic gate; and
a nonlinear transmission line (NLTL) arranged along the signal path for receiving the amplified waveform from the amplifier,
wherein the NLTL comprises a pair of high-impedance transmission lines loaded periodically with varactor diodes formed on a gallium arsenide (GaAs) substrate; and
one of an active and a passive bias associated with the NLTL to shape the amplified waveform so as to add harmonic content at higher frequencies to the amplified waveform;
whereby the output RF signal transmitted from the output port to the second port of the VNA comprises additional harmonic content at higher frequencies compared to the input RF signal.

10. The harmonic phase standard of claim 9, wherein the NLTL is biased to sharpen the falling edges of the amplified waveform.

11. The harmonic phase standard of claim 9, wherein the logic gate is a monocycle former.

12. The harmonic phase standard of claim 11, further comprising:
a first power splitter arranged along the signal path for splitting an RF signal received from the RF signal source and outputting a first RF signal to the logic gate and outputting a second RF signal; and
a second power splitter for splitting the at least one of unipolar and bipolar pulses into two output signals at the output port and another output port.

13. The harmonic phase standard of claim 9, further comprising:
a pulse-forming network arranged along the signal path, and
wherein the pulse-forming network receives a waveform output from the NLTL and provides at least one of unipolar and bipolar pulses.

14. The harmonic phase standard of claim 13, wherein the pulse-forming network and the second power splitter comprise:
a coplanar waveguide having a central conductor arranged between a pair of ground planes; and
a set of air bridges forming a pair of open-circuited stubs connected between ground planes and spanning over the central conductor.

15. A method of calibrating a vector network analyzer (VNA) for measuring the phase response of a device under test (DUT) to a test signal, comprising:
providing a harmonic phase standard comprising,
an input port for receiving an input RF signal,
an output port for transmitting an output RF signal,
a signal path extending between the input port and the output port for propagating a radio frequency (RF) signal from the input port to the output port,
a logic gate arranged along the signal path for receiving a RF signal and outputting a waveform having sharpened edges relative to the RF signal,
an amplifier arranged along the signal path to amplify the waveform output by the logic gate, and
a nonlinear transmission line (NLTL) arranged along the signal path for receiving the amplified waveform from the amplifier, wherein the NLTL is biased to sharpen the falling edges of the amplified waveform edges so as to add harmonic content at higher frequencies to the amplified waveform,
whereby the output RF signal transmitted from the output port comprises additional harmonic content at higher frequencies compared to the input RF signal;
connecting a first port of the VNA to the input port of the harmonic phase standard;
connecting a second port of the VNA to the output port of the harmonic phase standard;
transmitting a set of RF signals at a set of frequencies to the input of the harmonic phase standard via the first port of the VNA;
receiving a set of response signals in response to the set of RF signal from the output of the harmonic phase standard via the second port of the VNA;
generating a calibration file for correcting relative phases of frequency components corresponding to the set of frequencies; and storing the calibration file at the VNA for measuring the phase response of the DUT.

* * * * *